(12) United States Patent
Akiba

(10) Patent No.: US 10,114,150 B2
(45) Date of Patent: Oct. 30, 2018

(54) OPTICAL MULTILAYER COATING, OPTICAL LENS, AND METHOD OF MANUFACTURING OPTICAL MULTILAYER COATING

(71) Applicant: CANON KABUSHIKI KAISHA, Tokyo (JP)

(72) Inventor: Hideo Akiba, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 42 days.

(21) Appl. No.: 15/103,781

(22) PCT Filed: Dec. 5, 2014

(86) PCT No.: PCT/JP2014/006108
§ 371 (c)(1),
(2) Date: Jun. 10, 2016

(87) PCT Pub. No.: WO2015/087534
PCT Pub. Date: Jun. 18, 2015

(65) Prior Publication Data
US 2016/0313473 A1    Oct. 27, 2016

(30) Foreign Application Priority Data
Dec. 13, 2013 (JP) ................................. 2013-258141

(51) Int. Cl.
*G02B 1/10* (2015.01)
*G02B 1/115* (2015.01)
(Continued)

(52) U.S. Cl.
CPC .......... *G02B 1/115* (2013.01); *C03C 17/3452* (2013.01); *C23C 14/0057* (2013.01); *C23C 14/08* (2013.01); *C23C 14/35* (2013.01)

(58) Field of Classification Search
CPC ......... G02B 1/115; G02B 1/111; G02B 1/113; G02B 1/10; B32B 17/1014;
(Continued)

(56) References Cited

U.S. PATENT DOCUMENTS 4,273,826 A * 6/1981 McCollister ............ C03C 15/00
359/652
5,332,618 A    7/1994 Russel
(Continued)

FOREIGN PATENT DOCUMENTS

JP    9-291358 A    11/1997
WO    96/41215 A1   12/1996

OTHER PUBLICATIONS

David Grosso et al., "Ultralow-dielectric-constant optical thin films built from . . . ", Letters vol. 6 No. 572 Aug. 1, 2007.

*Primary Examiner* — Bumsuk Won
*Assistant Examiner* — Balram Parbadia
(74) *Attorney, Agent, or Firm* — Canon U.S.A., Inc. IP Division

(57) ABSTRACT

The present invention relates to an optical multilayer coating placed on or above a substrate. The optical multilayer coating includes a high-refractive index layer with a refractive index of 1.76 to 2.7, a magnesium oxyfluoride layer, and a magnesium fluoride layer. The high-refractive index layer, the magnesium oxyfluoride layer, and the magnesium fluoride layer are stacked on or above the substrate in this order and are in contact with each other. The magnesium oxyfluoride layer has a composition represented by the following formula:

$$Mg_xO_yF_z \quad (1)$$

where z/x is not less than 0.01 nor greater than 1.45 and z/y is not less than 0.01 nor greater than 3.17.

15 Claims, 5 Drawing Sheets

(51) Int. Cl.
*C03C 17/34* (2006.01)
*C23C 14/00* (2006.01)
*C23C 14/08* (2006.01)
*C23C 14/35* (2006.01)

(58) Field of Classification Search
CPC .............. C03C 17/3417; C03C 17/366; C03C 2217/734; C03C 17/3452; C03C 2217/285
See application file for complete search history.

(56) References Cited

U.S. PATENT DOCUMENTS

| | | | | |
|---|---|---|---|---|
| 2001/0031365 | A1* | 10/2001 | Anderson | B32B 17/10036 428/432 |
| 2009/0290219 | A1* | 11/2009 | Terayama | G02B 1/115 359/586 |
| 2012/0212830 | A1* | 8/2012 | Mewes | G02B 27/142 359/629 |
| 2014/0147594 | A1* | 5/2014 | Jewhurst | G02B 1/111 427/373 |

\* cited by examiner

[Fig. 1]
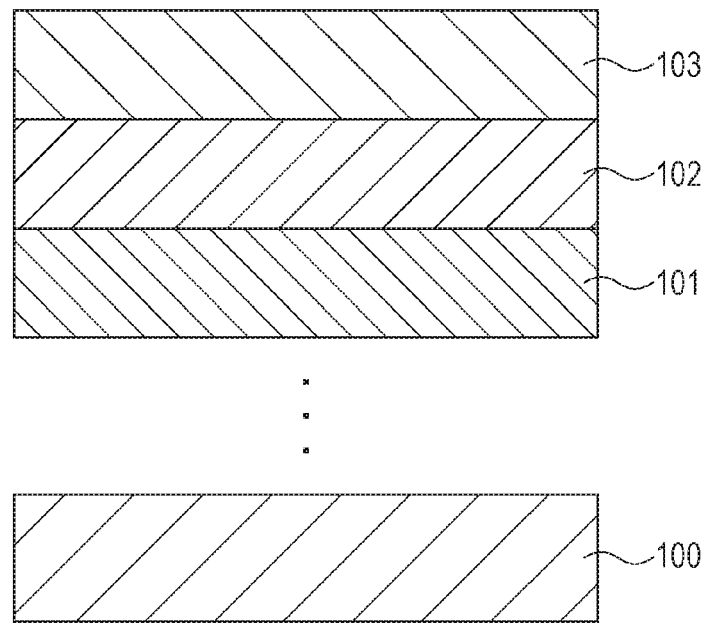

[Fig. 2]
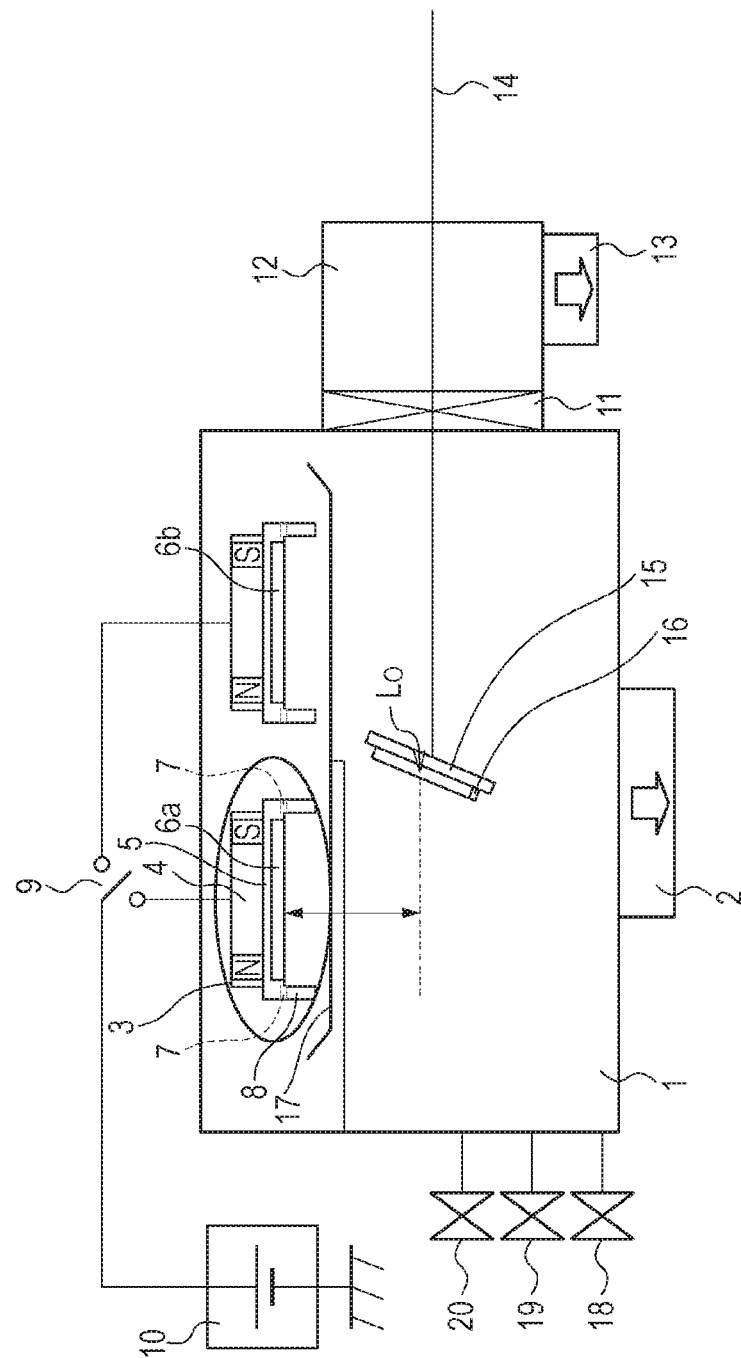

[Fig. 3A]
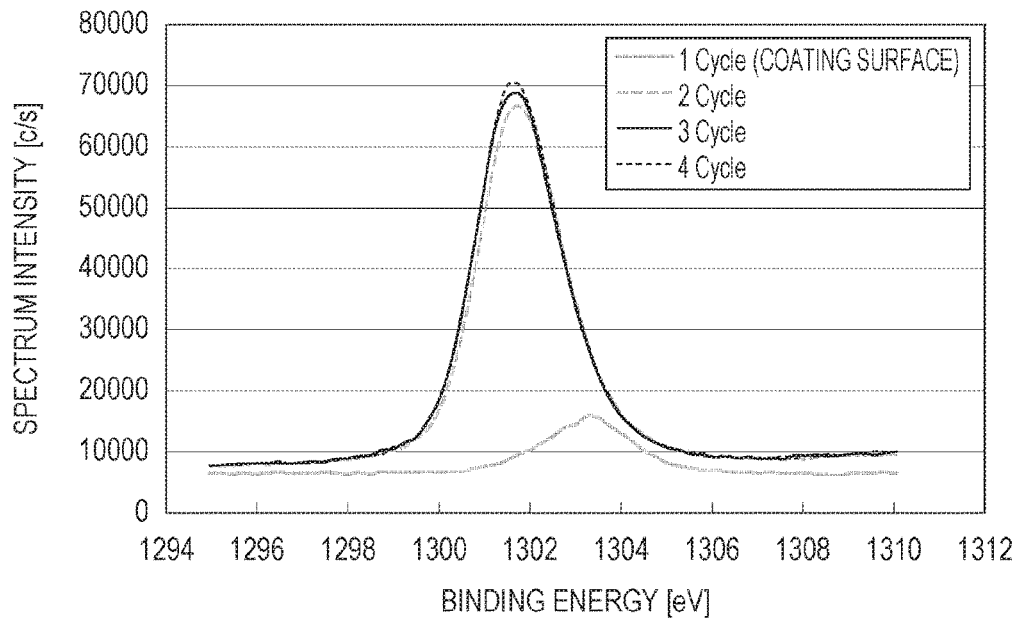
[Fig. 3B]
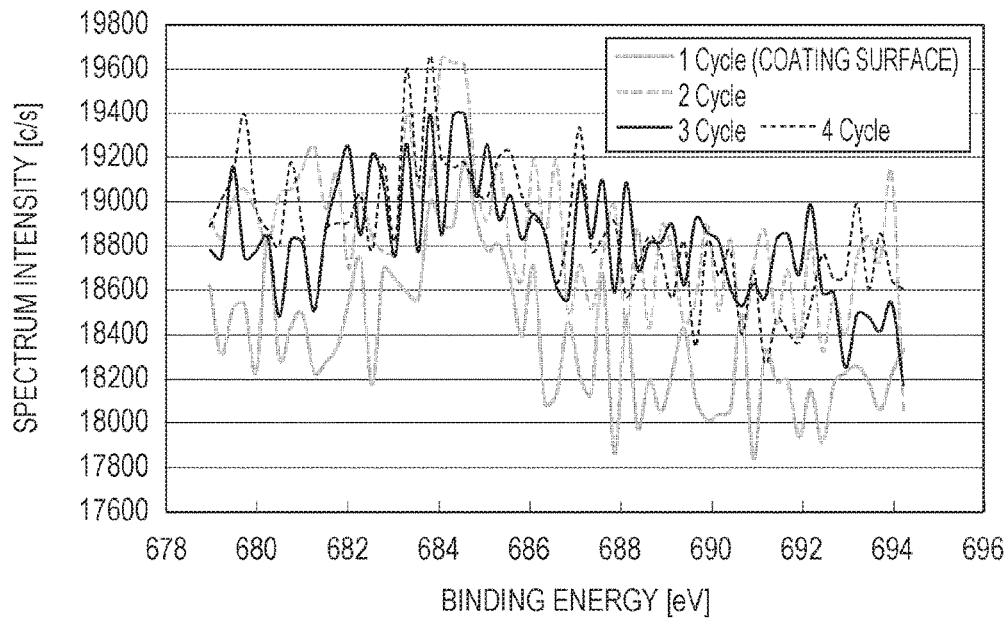

[Fig. 3C]
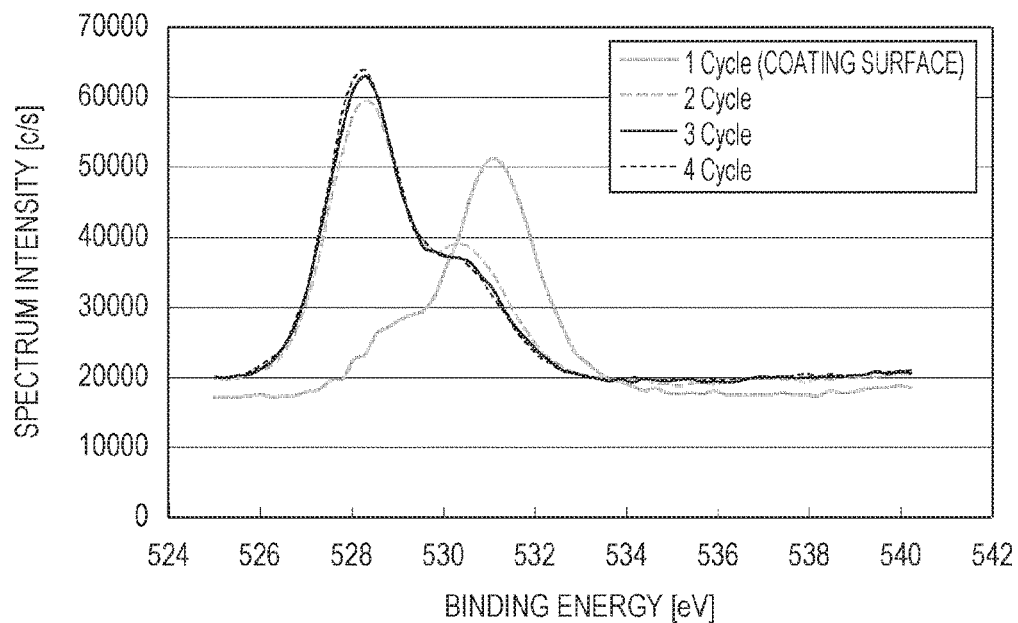
[Fig. 4A]
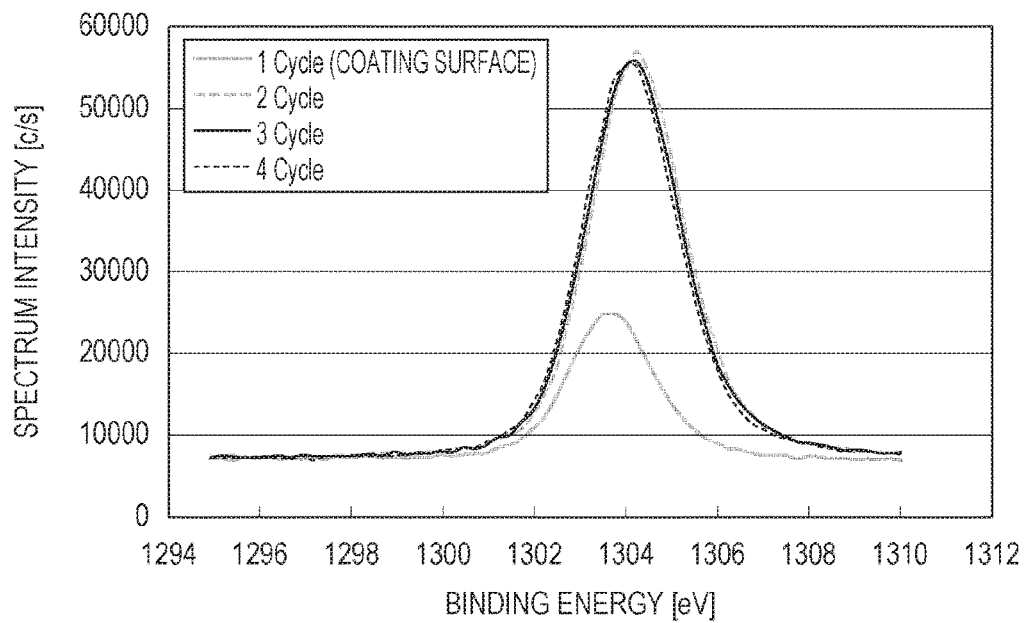

[Fig. 4B]
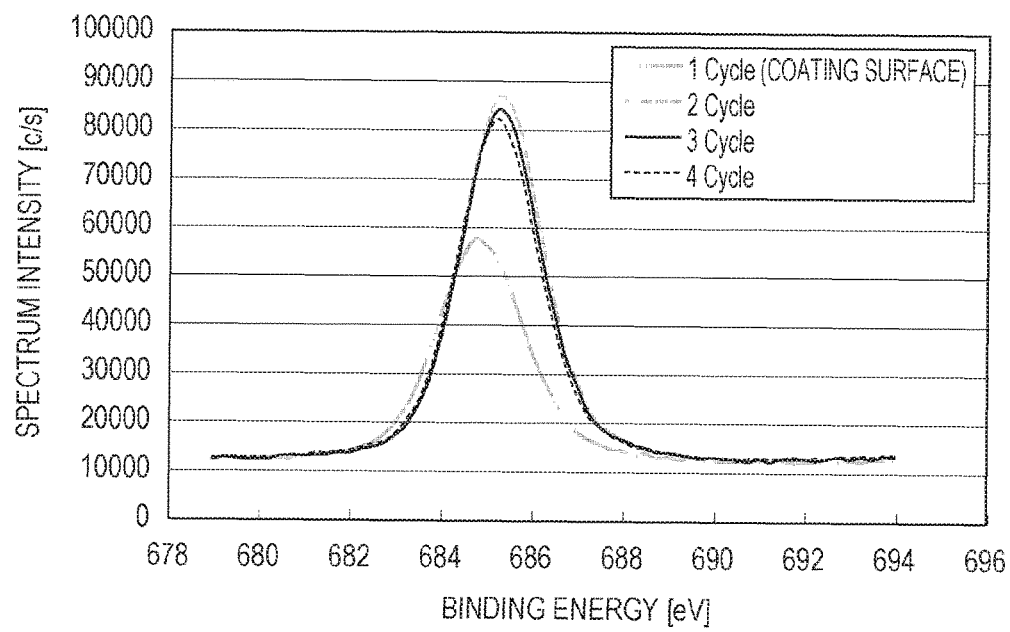
[Fig. 4C]
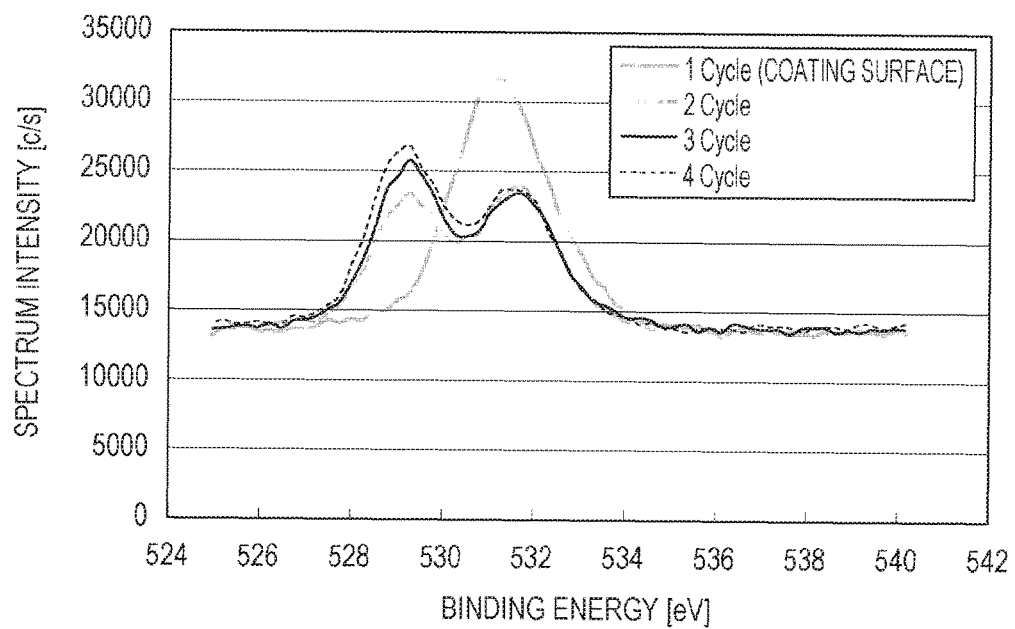

OPTICAL MULTILAYER COATING, OPTICAL LENS, AND METHOD OF MANUFACTURING OPTICAL MULTILAYER COATING

CROSS-REFERENCE TO RELATED APPLICATIONS

This application is a National Stage filing of International Application No. PCT/JP2014/006108 filed Dec. 5, 2014, which claims the benefit of Japanese Patent Application No. 2013-258141, filed Dec. 13, 2013, the disclosures of each of which are hereby incorporated by reference herein in their entirety.

TECHNICAL FIELD

The present invention relates to an optical multilayer coating which is an antireflective coating used for camera lenses and the like, an optical lens, and a method of manufacturing an optical multilayer coating.

BACKGROUND ART

Metal fluorides such as aluminium fluoride ($AlF_3$) and magnesium fluoride ($MgF_2$) are used as low-refractive index materials for antireflective coatings for optical elements such as lenses and mirrors with visible light.

A sputtering process is superior to vacuum vapor deposition processes in terms of reproducibility, the control of film thickness distribution, low-temperature deposition, and the like and therefore is attracting attention as a method of forming an antireflective coating (thin film) containing a metal fluoride. The sputtering process uses plasma particles such as charged particles and ejects atoms from a material to form a film. In the case of depositing a metal fluoride, it is difficult for the sputtering process to control the reactivity of fluorine with a sputtering material or a base material on which a film is formed and the damage of a substrate or a film by charged particles because of these features. In the case of forming an antireflective coating containing a metal fluoride on a base material of a glass substrate or a metal oxide film, fluorine atoms, which have strong oxidizing properties, enter a base interface and therefore the base material of the glass substrate or the metal oxide film is reduced to form an altered layer with electronic defects. Therefore, there is a problem in that absorption occurs at a wavelength longer than the wavelength corresponding to the band gap.

PTL 1 discloses an optical thin film in which a metal oxide thin film containing at least one of $SiO_2$, $ZrO_2$, and $Al_2O_3$ is placed between a glass substrate and a metal fluoride film ($MgF_2$ film) for the purpose of suppressing light absorption occurring mainly at the boundary between the glass substrate and a film and also discloses a method of manufacturing the optical thin film.

An optical thin film including a metal oxide thin film which is placed between a base, such as a glass substrate, made of a metal oxide material and a metal fluoride film as disclosed in PTL 1 and which contains at least one of $SiO_2$, $ZrO_2$, and $Al_2O_3$ can be used to suppress light absorption occurring mainly at the boundary between the glass substrate and a film. However, available refractive index is limited to 1.46 ($SiO_2$), 1.63 ($Al_2O_3$) and 2.05 ($ZrO_2$). Furthermore, in the case of forming a metal oxide thin film containing $SiO_2$ between a substrate and a metal fluoride film, there is a problem in that the metal fluoride thin film is likely to be peeled from the metal oxide film.

CITATION LIST

Patent Literature

PTL 1: Japanese Patent Laid-Open No. 9-291358

SUMMARY OF INVENTION

The present invention provides an optical multilayer coating placed on or above a substrate. The optical multilayer coating includes a high-refractive index layer with a refractive index of 1.76 to 2.7, a magnesium oxyfluoride layer, and a magnesium fluoride layer. The high-refractive index layer, the magnesium oxyfluoride layer, and the magnesium fluoride layer are stacked on or above the substrate in this order and are in contact with each other. The magnesium oxyfluoride layer has a composition represented by the following formula:

$$Mg_xO_yF_z \qquad (1)$$

where z/x is not less than 0.01 nor greater than 1.45 and z/y is not less than 0.01 nor greater than 3.17.

The present invention provides an optical lens. The optical lens includes an optical multilayer coating placed on or above a lens. The optical multilayer coating includes a high-refractive index layer with a refractive index of 1.76 to 2.7, a magnesium oxyfluoride layer, and a magnesium fluoride layer. The high-refractive index layer, the magnesium oxyfluoride layer, and the magnesium fluoride layer are stacked on or above the lens in this order and are in contact with each other. The magnesium oxyfluoride layer has a composition represented by the following formula:

$$Mg_xO_yF_z \qquad (1)$$

where z/x is not less than 0.01 nor greater than 1.45 and z/y is not less than 0.01 nor greater than 3.17.

The present invention provides a method of manufacturing an optical multilayer coating. The method includes a step of providing a high-refractive index layer on or above a substrate, a step of forming a magnesium oxyfluoride layer on the high-refractive index layer, and a step of forming a magnesium fluoride layer on the magnesium oxyfluoride layer. The magnesium oxyfluoride layer has a composition represented by the following formula:

$$Mg_xO_yF_z \qquad (1)$$

where z/x is not less than 0.01 nor greater than 1.45 and z/y is not less than 0.01 nor greater than 3.17.

Further features of the present invention will become apparent from the following description of exemplary embodiments with reference to the attached drawings.

BRIEF DESCRIPTION OF DRAWINGS

FIG. 1 is a schematic view of an optical multilayer coating according to the present invention.

FIG. 2 is a schematic view of a deposition apparatus for manufacturing an optical multilayer coating according to the present invention.

FIG. 3A is a graph showing the XPS spectrum of an Mg1s peak of an $Mg_xO_yF_z$ layer formed at an HFC-245fa flow rate of 0 Pa m³/s (0 sccm) in Example 2.

FIG. 3B is a graph showing the XPS spectrum of an O1s peak of the $Mg_xO_yF_z$ layer formed at an HFC-245fa flow rate of 0 Pa m³/s (0 sccm) in Example 2.

FIG. 3C is a graph showing the XPS spectrum of an F1s peak of the $Mg_xO_yF_z$ layer formed at an HFC-245fa flow rate of 0 Pa m³/s (0 sccm) in Example 2.

FIG. 4A is a graph showing the XPS spectrum of an Mg1s peak of an $Mg_xO_yF_z$ layer formed at an HFC-245fa flow rate of $1.77 \times 10^{-3}$ Pa m³/s (10.5 sccm) in Example 2.

FIG. 4B is a graph showing the XPS spectrum of an O1s peak of the $Mg_xO_yF_z$ layer formed at an HFC-245fa flow rate of $1.77 \times 10^{-3}$ Pa m³/s (10.5 sccm) in Example 2.

FIG. 4C is a graph showing the XPS spectrum of an F1s peak of the $Mg_xO_yF_z$ layer formed at an HFC-245fa flow rate of $1.77 \times 10^{-3}$ Pa m³/s (10.5 sccm) in Example 2.

DESCRIPTION OF EMBODIMENTS

Embodiments of the present invention are described below with reference to the attached drawings.
Optical Multilayer Coating An optical multilayer coating according to an embodiment of the present invention is placed on a substrate and has an antireflective function.

As shown in FIG. 1, the optical multilayer coating includes a high-refractive index layer 101, magnesium oxyfluoride layer 102, and magnesium fluoride layer (low-refractive index layer) 103 which are stacked on or above a substrate 100 in this order and which are in contact with each other.

The substrate 100 can be used for mirrors, lenses, prisms, and the like. In particular, the substrate 100 can be preferably used for lenses. The high-refractive index layer 101 may be made of a material with a refractive index of 1.76 to 2.7. A high-refractive index material used to form the high-refractive index layer 101 may be $ZrO_2$, $Ta_2O_5$, $Nb_2O_5$, $TiO_2$, or the like. $Ta_2O$, $Nb_2O_5$, and $TiO_2$ are materials that are readily reduced. Among these materials, $Ta_2O_5$ or $Nb_2O_5$ is preferably used. The magnesium oxyfluoride layer 102 has a composition represented by the following formula:

$$Mg_xO_yF_z \quad (1)$$

where z/x is not less than 0.01 nor greater than 1.45 and z/y is not less than 0.01 nor greater than 3.17.

The refractive index of the magnesium oxyfluoride layer 102 can be adjusted to 1.4 to 1.65. The magnesium oxyfluoride layer 102 preferably has a thickness of 5 nm to 1.5 micrometer and more preferably 8.7 nm to 136 nm. The magnesium oxyfluoride layer 102 has a role in preventing the occurrence of electronic defects due to the fact that the high-refractive index layer 101 is reduced when the magnesium oxyfluoride layer 102 is formed.

The magnesium fluoride layer 103 mainly contains magnesium fluoride. The magnesium fluoride layer 103 preferably contains 80% by weight or more magnesium fluoride and more preferably 90% by weight or more magnesium fluoride. The magnesium fluoride layer 103 preferably has a refractive index of 1.40 or less at a wavelength of 550 nm.

According to the optical multilayer coating, light absorption occurring at interfaces between layers is readily suppressed and the refractive index of the magnesium oxyfluoride layer 102, which is placed between the magnesium fluoride layer 103 and the high-refractive index layer 101, is readily adjusted.
Optical Lens An optical lens according to an embodiment of the present invention includes an optical multilayer coating, placed on an optical lens, having the above antireflective function.

The optical lens may be made of optical glass, plastic, or the like.

Method of Manufacturing Optical Multilayer Coating

A method of manufacturing the optical multilayer coating according to an embodiment of the present invention includes a step of providing the high-refractive index layer 101 on or above the substrate 100, a step of forming the magnesium oxyfluoride layer 102 on the high-refractive index layer 101, and a step of forming the magnesium fluoride layer 103 on the magnesium oxyfluoride layer 102 by a sputtering process.

The high-refractive index layer 101 is provided on or above the substrate 100 by an arbitrary process such as a vapor deposition process or a sputtering process. The substrate 100 may be made of crystalline calcium fluoride, quartz glass, silicon, glass, resin, or the like. A material for the high-refractive index layer 101 and the thickness thereof preferably meet the conditions described for the optical multilayer coating.

The step of forming the magnesium oxyfluoride layer 102 is described below. The step of forming the magnesium oxyfluoride layer 102 can use an arbitrary process such as a vapor deposition process or a sputtering process. In the case of forming the magnesium oxyfluoride layer 102 by the sputtering process, magnesium can be used as a target. Introduced gases may be oxygen and a fluorinated gas. The fluorinated gas may be a fluorocarbon, a hydrofluorocarbon, or the like. The magnesium oxyfluoride layer 102 is prepared by adjusting the ratio of oxygen to the fluorinated gas so as to have a composition represented by the following formula:

$$Mg_xO_yF_z \quad (1)$$

where z/x is not less than 0.01 nor greater than 1.45 and z/y is not less than 0.01 nor greater than 3.17.

The step of forming the magnesium fluoride layer 103 is described below. Magnesium can be used as a target. An introduced gas may be a fluorinated gas. The fluorinated gas may be a fluorocarbon, a hydrofluorocarbon, or the like. A material for the magnesium fluoride layer 103 and the thickness thereof preferably meet the conditions described for the optical multilayer coating.

In the method of manufacturing the optical multilayer coating, before the magnesium fluoride layer 103 is formed, the magnesium oxyfluoride layer 102 is formed. Thus, even in the case of depositing magnesium fluoride by a sputtering process, electronic defects can be prevented from being caused at the interface between the magnesium oxyfluoride layer 102 and the magnesium fluoride layer 103. Accordingly, the optical multilayer coating can be manufactured such that light absorption at the interface therebetween is suppressed.

In the method of manufacturing the optical multilayer coating, the step of forming the magnesium oxyfluoride layer 102 and the step of forming the magnesium fluoride layer 103 preferably use a reactive sputtering process. In the case of forming these two layers by the reactive sputtering process, the optical multilayer coating can be readily manufactured at low cost in such a manner that a target material is not switched and the flow rates of an oxygen-containing gas and a fluorinated gas are varied.

EXAMPLES

Example 1

FIG. 2 is a schematic view of a deposition apparatus used in examples.

The deposition apparatus includes a deposition chamber 1 maintained under vacuum and a ventilator 2 including a vacuum pump for evacuating the deposition chamber 1 and the like. The deposition chamber contains target units 3. Each target unit 3 is composed of a cooling box 4, a magnet, a backing plate 5, and a target 6a or 6b. The cooling box 4 is placed in the target unit 3, contains the magnet, and can cool the target 6a or 6b in such a manner that cooling water supplied from outside is circulated therein. The magnet is placed such that a magnetic field is formed in a direction parallel to a surface of the target 6a or 6b. The cooling box 4 is a chiller (not shown) in which cooling water adjusted to a desired temperature flows at a constant flow rate such that the surface temperature of the target 6a or 6b is maintained constant.

The cooling box 4 is attached to the backing plate 5, which serves as a cathode. The target 6a or 6b is fixed on a side surface of the backing plate 5. An anode 8 is placed under the backing plate 5 with an insulating material 7 therebetween. The anode 8 and the backing plate 5 (cathode) are connected to a direct-current power supply 10 through a changeover switch 9. A direct current can be supplied to the target 6a or 6b by switching the changeover switch 9.

The deposition chamber 1 is adjacent to a load lock chamber 12 with a gate valve 11 therebetween. The load lock chamber 12 includes an exhaust system 13 including a rotary pump. A substrate holder 15 is linked to a transfer mechanism 14 including a transfer rod so as to freely move between the load lock chamber 12 and the deposition chamber 1. The substrate holder 15 can hold a substrate 16. This enables the deposition apparatus to charge and discharge the substrate 16 without exposing the deposition chamber 1 to air. The substrate holder 15 is equipped with a revolution mechanism (not shown) for varying the relative angle between a surface of the target 6a or 6b and a substrate-holding surface of the substrate holder 15 and a rotary mechanism (not shown) for the substrate holder 15. The substrate 16 held on the substrate holder 15 revolves and rotates on an axis passing through the center $L_0$ of the substrate 16. A shielding plate 17 is placed between the substrate holder 15 and the targets 6a and 6b such that no film is formed on the substrate 16, such as a lens, until discharge becomes stable. The shielding plate 17 can be opened and closed at high speed.

Furthermore, the deposition chamber 1 can be supplied with gases from a sputtering gas inlet port 18 and reactive gas inlet ports 19 and 20 through a gas supply system including a mass flow controller. An inert gas, such as Ar, He, Ne, Kr, or Xe, used as a sputtering gas can be introduced from the sputtering gas inlet port 18. A fluorocarbon gas and $O_2$, which are used as a reactive gas, can be introduced from the reactive gas inlet port 19 and the reactive gas inlet port 20, respectively. The gases introduced herein are preferably controlled for flow rate, purity, and pressure with the mass flow controller and a gas purifier.

In Example 1, substrates 16 used as the substrate 100 were $SiO_2$ substrates. Various magnesium oxyfluoride layers ($Mg_xO_yF_z$ layers) 102 were prepared on the $SiO_2$ substrates by a sputtering process in such a manner that the ratio of the fluorocarbon gas to a high-refractive index material, $Ta_2O_5$, to $O_2$ used as a reactive gas was varied.

Metallic Ta and metallic Mg were used as materials for the targets 6a and 6b. Reactive gases used were the fluorocarbon "HFC-245fa" (1,1,1,3,3-pentafluoropropane, $CHF_2CH_2CF_3$) and $O_2$.

First, each $Ta_2O_5$ layer was formed. Each cleaned substrate 16 was placed in the load lock chamber 12. The load lock chamber 12 was evacuated to $1\times10^{-3}$ Pa or less. After evacuation was completed, the substrate 16 was held on the substrate holder 15, was brought into the deposition chamber 1 through the gate valve 11, and was then placed in a deposition position in the deposition chamber 1. The distance between the target 6a and the substrate 16 was about 80 mm during deposition.

Next, the shielding plate 17 was closed, Ar was introduced from the sputtering gas inlet port 18 at $5.07\times10^{-2}$ Pa $m^3$/s (300 sccm), $O_2$ was introduced from the reactive gas inlet port 19 at $3.38\times10^{-3}$ Pa $m^3$/s (20 sccm), and the total pressure in the deposition chamber 1 was set to 0.5 Pa. A sputtering power of 250 W was applied to the backing plate 5 (cathode), whereby magnetron plasma was generated on a surface of the target 6a. In this operation, a rectangular voltage was superimposed at 5 kHz such that the polarity of the target surface was reversed, whereby the charge of the target surface or the like was canceled such that discharge could be stably maintained. After discharge was continued for a while and became stable, the shielding plate 17 was opened, whereby deposition was started. The thickness of each layer was controlled by the deposition time on the basis of the predetermined relationship between the deposition time and the layer thickness. The $Ta_2O_5$ layer was formed so as to have a thickness of about 100 nm. Thereafter, the supply of the gases and the application of power were stopped and the shielding plate 17 was closed, whereby the formation of the $Ta_2O_5$ layer was completed.

Next, a magnesium oxyfluoride layer ($Mg_xO_yF_z$ layer) was formed on the $Ta_2O_5$ layer formed on the substrate 16. First, a target supplied with direct-current power was switched from the target 6a, which contained Ta, to the target 6b, which contained Mg. The substrate 16 was set in such a position that the substrate 16 does not cross the vertical projection plane of a surface of the target 6b and the in-plane distribution of the thickness is constant. This allowed the influence of negative ions generated on a surface of the target 6b and accelerated by a cathode voltage on the substrate holder 15 to be prevented.

Next, Ar was introduced from the sputtering gas inlet port 18 at $5.07\times10^{-2}$ Pa $m^3$/s (300 sccm). Furthermore, HFC-245fa and $O_2$ were introduced from the reactive gas inlet port 19 and the reactive gas inlet port 20, respectively. A sputtering power of 250 W was applied to the backing plate 5 (cathode). In this operation, a rectangular voltage was superimposed at 5 kHz such that the polarity of the target surface was reversed, whereby magnetron plasma was generated. After discharge was continued for a while and became stable, the shielding plate 17 was opened, whereby deposition was started. The thickness was controlled by the deposition time. A magnesium oxyfluoride layer was formed so as to have a thickness of about 30 nm. Herein, the flow rate of introduced HFC-245fa ranged from 0 Pa $m^3$/s to $2.54\times10^{-3}$ Pa $m^3$/s (0 sccm to 15 sccm) and various magnesium oxyfluoride layers with different F/O ratios were formed.

Table 1 shows the light absorption of samples including $SiO_2$ substrates, $Ta_2O_5$ layers, and $Mg_xO_yF_z$ layers formed by varying the flow rate of HFC-245fa under the experiment conditions and the refractive index of the $Mg_xO_yF_z$ layers at a wavelength of 450 nm.

TABLE 1

| No. | Flow rate of $O_2$ [SCCM] | Flow rate of HFC-245fa [SCCM] | Light absorption properties | Light absorption [%] | Refractive index (550 nm) |
|---|---|---|---|---|---|
| 1 | 8 | 0 | A | 0.1 | 1.72 |
| 2 | 8 | 4.5 | A | 0.2 | 1.45 |
| 3 | 8 | 7.5 | A | 6.2 | 1.43 |
| 4 | 8 | 10.5 | A | 0.3 | 1.41 |
| 5 | 8 | 12 | B | 0.8 | 1.4 |
| 6 | 8 | 15 | B | 3.2 | 1.39 |

The refractive index and the absorption were calculated on the basis of the reflectivity and transmittance of a sample including a $SiO_2$ substrate, a $Ta_2O_5$ layer, and an $Mg_xO_yF_z$ layer. A sample with a light absorption of 0.6% or more was rated as B and a sample with a light absorption of less than 0.6% was rated as A.

As is clear from results shown in Table 1, forming an $Mg_xO_yF_z$ layer on a $Ta_2O_5$ layer varies the light absorption depending on the flow rate of HFC-245fa. When the flow rate of HFC-245fa is $1.77 \times 10^{-3}$ Pa m$^3$/s (10.5 sccm) or less, the light absorption is very little, less than 0.6%. However, when the flow rate of HFC-245fa is $2.03 \times 10^{-2}$ Pa m$^3$/s (12 sccm) or more, a light absorption of several percent is caused. When the flow rate of HFC-245fa is 0 Pa m$^3$/s (0 sccm), the refractive index is less than 1.75, which is the refractive index of a common MgO bulk. This is because even when the flow rate of HFC-245fa is 0 Pa m$^3$/s (0 sccm), an F component remains in the deposition chamber 1 and therefore a layer contains the F component on the order of percent.

Example 2

For the samples including the $SiO_2$ substrates, the $Ta_2O_5$ layers, and the $Mg_xO_yF_z$ layers shown in Table 1, the composition of the $Mg_xO_yF_z$ layers was analyzed by X-ray photoelectron spectroscopy (XPS). A measurement instrument used was PHI Quantera SXM available from ULVAC-PHI, Inc. Analysis conditions are as described below.

X-ray source: monochromatized Al (1,486.6 eV)
Detection range: 100 micrometer phi
Detection depth: about 4 nm to 5 nm (a take-off angle of 45 degrees)
Measurement spectrum: Mg1s, O1s, F1s
Sputtering condition: Ar+1 kV
Sputtering rate: about 1 nm/min (in terms of $SiO_2$), about 5 min/cycle FIG. 3A, FIG. 3B, and FIG. 3C show the montage spectrum of an Mg1s peak, the montage spectrum of an O1s peak, and the montage spectrum of an F1s peak, respectively, of an $Mg_xO_yF_z$ layer measured in the depth direction thereof, the $Mg_xO_yF_z$ layer being formed at an HFC-245fa flow rate of 0 Pa m$^3$/s (0 sccm). FIG. 4A, FIG. 4B, and FIG. 4C show the montage spectrum of an Mg1s peak, the montage spectrum of an O1s peak, and the montage spectrum of an F1s peak, respectively, of an $Mg_xO_yF_z$ layer measured in the depth direction thereof, the $Mg_xO_yF_z$ layer being formed at an HFC245fa flow rate of $1.27 \times 10^{-3}$ Pa m$^3$/s (7.5 sccm). In general, the binding energy of Mg1s of $MgF_2$ is about 1,305 eV, the binding energy of F1s of $MgF_2$ is about 685 eV, and the binding energy of O1s of MgO is about 530 eV. It can be confirmed that each layer contains the F component even when the flow rate of HFC-245fa is 0 Pa m$^3$/s (0 sccm).

Table 2 shows the intensity ratio of an O1s peak and an F1s peak of each of the $Mg_xO_yF_z$ layers formed by varying the flow rate of HFC-245fa as described in Example 1 in the case where the intensity of an Mg1s peak is 1. As is clear from Table 2, in an $Mg_xO_yF_z$ layer, the F1s/O1s ratio is 0.01 to 3.17 and the F1s/Mg1s ratio is about 0.01 to 1.45, the light absorption can be suppressed to less than 0.6%.

TABLE 2

| No. | Flow rate of HFC-245fa [SCCM] | Mg1s | F1s | O1s | F1s/Mg1s | F1s/O1s |
|---|---|---|---|---|---|---|
| 1 | 0 | 1.00 | 0.01 | 1.22 | 0.01 | 0.01 |
| 2 | 4.5 | 1.00 | 0.58 | 0.88 | 0.58 | 0.66 |
| 3 | 7.5 | 1.00 | 0.47 | 0.87 | 0.47 | 0.54 |
| 4 | 10.5 | 1.00 | 1.45 | 0.46 | 1.45 | 3.17 |
| 5 | 12 | 1.00 | 1.77 | 0.32 | 1.77 | 5.59 |
| 6 | 15 | 1.00 | 1.99 | 0.14 | 1.99 | 13.77 |

Example 3

Next, multilayer coatings including $Ta_2O_5$ layers, $Mg_xO_yF_z$ layers, and $MgF_2$ layers formed on $SiO_2$ substrates were measured for light absorption in the case of varying the thickness of the $Mg_xO_yF_z$ layers. The $Mg_xO_yF_z$ layers were formed similarly to the $Mg_xO_yF_z$ layer formed at an HFC-245fa flow rate of 0 Pa m$^3$/s (0 sccm) in the sample including the $SiO_2$ substrate, the $Ta_2O_5$ layer, and the $Mg_xO_yF_z$ layer shown in Table 1. Table 3 shows the relationship between the thickness of the $Mg_xO_yF_z$ layers and the light absorption of the multilayer coatings including the $Ta_2O_5$ layers (100 nm), $Mg_xO_yF_z$ layers (0 nm to 135 nm), and $MgF_2$ layers (about 30 nm) formed on the $SiO_2$ substrates (2 mm) at a wavelength of 450 nm. When the thickness of an $Mg_xO_yF_z$ layer is 8 nm or more, the light absorption can be suppressed to less than 0.6%.

TABLE 3

| Thickness of $Mg_xO_yF_z$ layer [nm] (on $Ta_2O_5$ layer) | Light absorption (% (450 nm)) |
|---|---|
| 0 | 2.5 |
| 8.7 | 0.573 |
| 12 | 0.2 |
| 21 | 0.177 |
| 136 | 0.044 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST

1 Deposition chamber
2 Ventilator (deposition chamber)
3 Target units
4 Cooling box
5 Backing plate
6a Target
6b Target
7 Insulating material
8 Anode
9 Changeover switch 10 Direct-current power supply
11 Gate valve
12 Load lock chamber
13 Exhaust system (load lock chamber)
14 Transfer mechanism
15 Substrate holder
16 Substrate
17 Shielding plate
18 Sputtering gas inlet port (Ar)
19 Reactive gas inlet port ($O_2$)
20 Reactive gas inlet port (hydrofluorocarbon)
100 Substrate
101 High-refractive index layer
102 Magnesium oxyfluoride layer
103 Magnesium fluoride layer

The invention claimed is:

1. An optical multilayer coating formed on or above a substrate, comprising:
a high-refractive index layer with a refractive index of 1.76 to 2.7;
a magnesium oxyfluoride layer; and
a magnesium fluoride layer,
the high-refractive index layer, the magnesium oxyfluoride layer, and the magnesium fluoride layer being stacked on or above the substrate in this order and being in direct contact with each other,
wherein the magnesium oxyfluoride layer has a composition represented by the following formula:

$$Mg_xO_yF_z \qquad (1)$$

where z/x is not less than 0.01 nor greater than 1.45 and z/y is not less than 0.01 nor greater than 3.17.

2. The optical multilayer coating according to claim 1, wherein the magnesium oxyfluoride layer has a thickness of 5 nm to 1.5 micrometer.

3. The optical multilayer coating according to claim 1, wherein the high-refractive index layer contains $Ta_2O_5$, $Nb_2O_5$, or $TiO_2$.

4. The optical multilayer coating according to claim 1, wherein the high-refractive index layer contains $Ta_2O_5$ or $Nb_2O_5$.

5. The optical multilayer coating according to claim 1, wherein the magnesium fluoride layer has a refractive index of 1.40 or less at a wavelength of 550 nm.

6. An optical lens comprising an optical multilayer coating formed on or above a lens, wherein the optical multilayer coating includes a high-refractive index layer with a refractive index of 1.76 to 2.7, a magnesium oxyfluoride layer, and a magnesium fluoride layer; the high-refractive index layer, the magnesium oxyfluoride layer, and the magnesium fluoride layer are stacked on or above the lens in this order and are in direct contact with each other; and the magnesium oxyfluoride layer has a composition represented by the following formula:

$$Mg_xO_yF_z \qquad (1)$$

where z/x is not less than 0.01 nor greater than 1.45 and z/y is not less than 0.01 nor greater than 3.17.

7. The optical lens according to claim 6, wherein the magnesium oxyfluoride layer has a thickness of 5 nm to 1.5 micrometer.

8. The optical lens according to claim 6, wherein the high-refractive index layer contains $Ta_2O_5$, $Nb_2O_5$, or $TiO_2$.

9. The optical lens according to claim 6, wherein the high-refractive index layer contains $Ta_2O_5$ or $Nb_2O_5$.

10. The optical lens according to claim 6, wherein the magnesium fluoride layer has a refractive index of 1.40 or less at a wavelength of 550 nm.

11. A method of manufacturing an optical multilayer coating, comprising:
a step of providing a high-refractive index layer on or above a substrate;
a step of forming a magnesium oxyfluoride layer on the high-refractive index layer; and
a step of forming a magnesium fluoride layer directly on the magnesium oxyfluoride layer,
wherein the magnesium oxyfluoride layer has a composition represented by the following formula:

$$Mg_xO_yF_z \qquad (1)$$

where z/x is not less than 0.01 nor greater than 1.45 and z/y is not less than 0.01 nor greater than 3.17.

12. The method of manufacturing the optical multilayer coating according to claim 11, wherein the step of forming the magnesium fluoride layer uses a sputtering process.

13. The method of manufacturing the optical multilayer coating according to claim 11, wherein the step of forming the magnesium oxyfluoride layer and the step of forming the magnesium fluoride layer use a sputtering process.

14. The method of manufacturing the optical multilayer coating according to claim 11, wherein the high-refractive index layer contains $Ta_2O_5$, $Nb_2O_5$, or $TiO_2$.

15. The method of manufacturing the optical multilayer coating according to claim 11, wherein the high-refractive index layer contains $Ta_2O_5$ or $Nb_2O_5$.

* * * * *